United States Patent
Lai et al.

(10) Patent No.: US 8,089,007 B2
(45) Date of Patent: Jan. 3, 2012

(54) PRINTED CIRCUIT BOARD

(75) Inventors: Ying-Tso Lai, Taipei Hsien (TW); Tsung-Sheng Huang, Taipei Hsien (TW); Shou-Kuo Hsu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 447 days.

(21) Appl. No.: 12/331,444

(22) Filed: Dec. 10, 2008

(65) Prior Publication Data

US 2010/0101837 A1    Apr. 29, 2010

(30) Foreign Application Priority Data

Oct. 23, 2008  (CN) .......................... 2008 1 0305118

(51) Int. Cl.
*H05K 1/11* (2006.01)

(52) U.S. Cl. ........ 174/262; 174/263; 174/264; 174/265; 174/266; 174/267; 361/791

(58) Field of Classification Search ................ 361/791; 174/255, 266, 772, 263, 264, 265, 267
See application file for complete search history.

(56) References Cited

U.S. PATENT DOCUMENTS

| 3,243,498 | A | * | 3/1966 | Lowell et al. | 174/266 |
| 3,991,347 | A | * | 11/1976 | Hollyday | 361/760 |
| 5,036,301 | A | * | 7/1991 | Takao et al. | 333/185 |
| 6,639,154 | B1 | * | 10/2003 | Cartier et al. | 174/255 |
| 7,750,765 | B2 | * | 7/2010 | Kushta et al. | 333/260 |
| 2007/0120219 | A1 | * | 5/2007 | Ito et al. | 257/530 |
| 2008/0190657 | A1 | * | 8/2008 | Kanetaka et al. | 174/263 |

OTHER PUBLICATIONS

JP58-187174 English abstact.*

* cited by examiner

*Primary Examiner* — Tuan T Dinh
*Assistant Examiner* — Steven Sawyer
(74) *Attorney, Agent, or Firm* — Altis Law Group, Inc.

(57) ABSTRACT

A printed circuit board includes a reference layer, at least one first hole defined in the reference layer and adjacent from a first pin in a first column of pins of an electronic component, and at least one second hole defined in the reference layer and adjacent from a second pin of the electronic component. The at least one second hole is defined in the reference layer and opposite to the at least one first hole. The second pin is in a neighboring second column of pins from the first column of pins. A diameter of the at least one first hole is greater than a diameter of the at least one second hole such that a difference in current flowing through the first pin and the second pin is reduced.

15 Claims, 1 Drawing Sheet

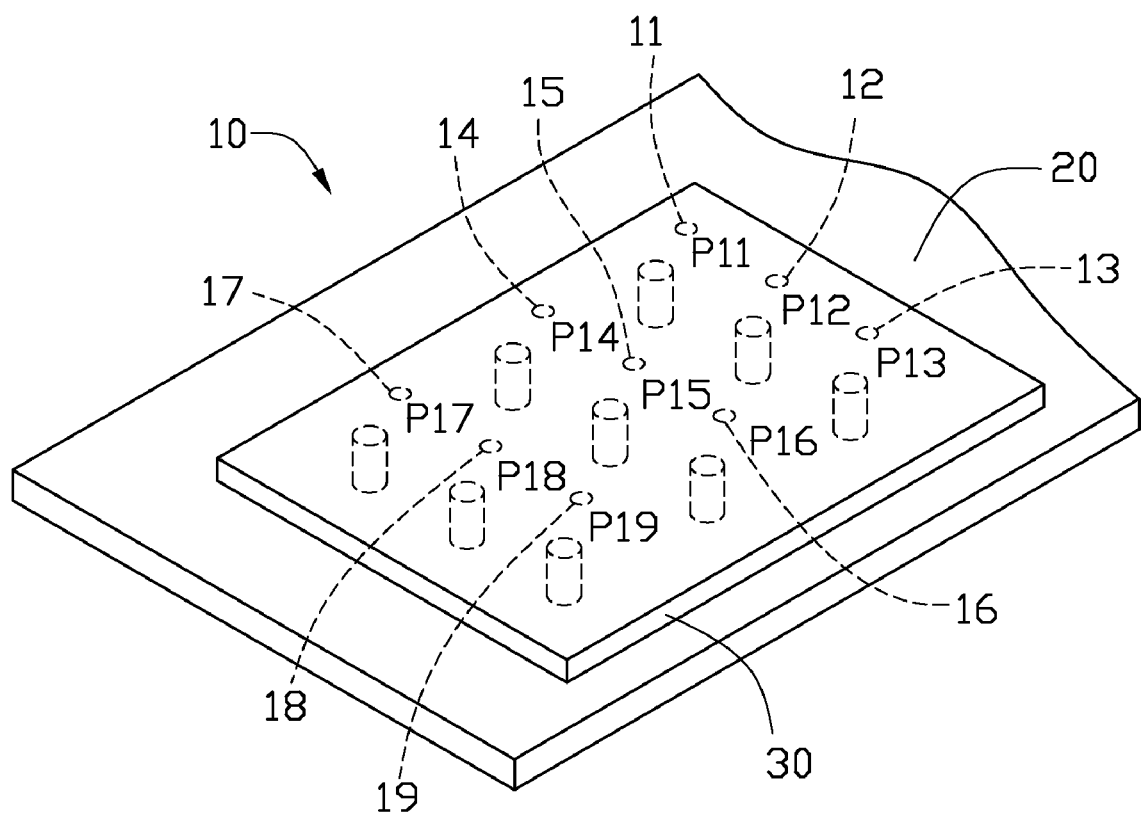

PRINTED CIRCUIT BOARD

BACKGROUND

1. Technical Field

The present disclosure relates to printed circuit boards, and more particularly to a printed circuit board with even current distribution.

2. Description of the Related Art

Electronic components are mounted on printed circuit boards for transmitting electronic signals. Each pin of an electronic component allows for a maximum current flow. To avoid an overcurrent through a pin, engineers usually use more than one pin to divide the current.

However, current flowing through different regions of the printed circuit board are different. Pins located in the different regions may have different current values. Thus, current through the printed circuit board must be reduced to prevent damage to the pins located in the region where current is too high, which may reduce current in the low areas to less than a desirable amount. As a result, the pins of the electronic component have low service efficiency.

What is needed, is a printed circuit board which can solve the above-mentioned problem.

BRIEF DESCRIPTION OF THE DRAWINGS

The FIGURE is a schematic diagram of one embodiment of a printed circuit board of the present disclosure.

DETAILED DESCRIPTION

Referring to the FIGURE, one embodiment of a printed circuit board 10 of the present disclosure includes a reference layer, such as a power layer 20, and a plurality of signal layers (not shown). The power layer 20 is configured to supply power from a power unit (not shown) exterior to electronic component mounted on the printed circuit board 10. An electronic component, such as a power connector 30 is mounted on the power layer 20 of the printed circuit board 10. The power connector 30 includes nine pins P11-P19. All the pins P11-P19 are connected to the power layer 20 of the printed circuit board 10 for transmitting electronic signals from the power layer 20 to other electronic components (not shown) connected to the power layer 20. Nine holes 11-19 are defined in the power layer 20, one for each of the pins P11-P19. Diameters of the holes 11-13 are R1. Diameters of the holes 14-16 are R2. Diameters of the holes 17-19 are R3. R2 is greater than R3, but less than R1. Each of the nine holes 11-19 is defined adjacent from a corresponding pin of the power connector 30, namely each of the nine holes 11-19 is empty and not allowed to have any pin P11-P19 of the power connector 30 enter therein (as shown in the FIGURE). Each of the nine holes 11-19 is adjacent from a corresponding pin by a selected distance and a selected angle which may differ depending on the embodiment. In the illustrated embodiment, R1 is about 0.35 mm, R2 is about 0.32 mm, and R3 is about 0.30 mm. It may be understood that in the illustrated embodiment of the FIGURE, holes 11-13, 14-16, and 17-19 are defined in different columns where holes 14-16 neighbor corresponding holes of holes 11-13. Accordingly, holes 17-19 neighbor corresponding holes of holes 17-19. Similarly, pins corresponding to the holes 11-19 are defined in their respective neighboring columns.

It is known that diameters of holes, such as the holes 11-19, are inversely proportional to their resistance. In other words, resistances of the holes 14-16 are higher than resistances of the next smaller holes 11-13, and lower than the resistances of the larger holes 17-19. Because resistance is a ratio of the degree to which an object opposes an electric current through the object, the electric current in the power layer 20 of the printed circuit board 10 tends to flow to a first region where the pins 11-13 are located.

In one exemplary example, the printed circuit board 10 was simulated using simulation software to obtain the following data. Current through the pins P11-P19 of the power connector 30 are listed in Table 1. However, it may be understood that these current values are exemplary and depend on various factors, which include, but are not limited to, environmental factors, material and compositions of the printed circuit board 10, and positions of the components electrically coupled to the printed circuit board 10.

TABLE 1

| | Pin | | | | | | | | |
|---|---|---|---|---|---|---|---|---|---|
| | P11 | P12 | P13 | P14 | P15 | P16 | P17 | P18 | P19 |
| Current (A) | 2.615 | 2.600 | 2.563 | 2.987 | 2.960 | 2.909 | 3.612 | 3.565 | 3.496 |

According to Table 1, current through the pins P11-P13 are approximately the same, current through the pins P14-P16 are approximately the same, and current through the pins P17-P19 are approximately the same. It can be seen that the differences in current through the different groups of pins P11-P13, P14-P16, and P17-P19 are obviously small. Accordingly, by use of placing holes of varying diameters selectively and judiciously throughout the power layer 20 near selective pins of an integrated circuit, a user can easily control current flow through each of the pins of the integrated circuit. It may be appreciated that controlling current flow through each of the pins of integrated circuit can limit inrush current, in one exemplary example.

The foregoing description of the various inventive embodiments of the disclosure has been presented only for the purposes of illustration and description and is not intended to be exhaustive or to limit the disclosure to the precise forms disclosed. Many modifications and variations are possible in light of the above teaching. The embodiments were chosen and described in order to explain the principles of the disclosure and their practical application so as to enable others of ordinary skill in the art to utilize the disclosure and various embodiments and with various modifications as are suited to the particular use contemplated. Alternately embodiments will become apparent to those of ordinary skill in the art to which the present disclosure pertains without departing from its spirit and scope. Accordingly, the scope of the present disclosure is defined by the appended claims rather than the foregoing description and the various inventive embodiments described therein.

What is claimed is:

1. A printed circuit board configured to mount an electronic component, the printed circuit board comprising:
   a reference layer;
   at least one first hole defined in the reference layer and adjacent from a first pin in a first column of pins of the electronic component when the electronic component is mounted on the printed circuit board; and
   at least one second hole defined in the reference layer and adjacent from a second pin of the electronic component when the electronic component is mounted on the printed circuit board, the at least one second hole defined in the reference layer and opposite to the at least one first hole, wherein the second pin is in a neighboring second column of pins from the first column of pins;

wherein each of the at least one first hole and the at least one second hole is not allowed to have any pin of the electronic component enter therein, a diameter of the at least one first hole is greater than a diameter of the at least one second hole causing a resistance of the at least one first hole to be less than a resistance of the at least one second hole such that a difference in current flowing through the first pin and the second pin is reduced.

2. The printed circuit board of claim 1, wherein the electronic component is a power connector.

3. The printed circuit board of claim 2, wherein the reference layer is a power layer.

4. The printed circuit board of claim 1, wherein the diameter of the at least one first hole is about 0.35 mm and the diameter of the at least one second hole is about 0.32 mm.

5. The printed circuit board of claim 1, wherein the diameter of the at least one first hole is about 0.32 mm and the diameter of the at least one second hole is about 0.30 mm.

6. A printed circuit board configured to mount an electronic component, the printed circuit board comprising:

a reference layer;

two first holes defined in the reference layer and adjacent from a first pin and a second pin of the electronic component correspondingly when the electronic component is mounted on the printed circuit board, wherein current through the first and second pin of the electronic component are approximately the same; and two second holes defined in the reference layer and adjacent from a third pin and a fourth pin of the electronic component correspondingly when the electronic component is mounted on the printed circuit board, and the two second holes being opposite to the two first holes, wherein current through the third and fourth pin of the electronic component are approximately the same;

wherein each of the first holes and the second holes is not allowed to have any pin of the electronic component enter therein, diameters of the two first holes are greater than diameters of the two second holes causing a resistance of the two first holes to be less than a resistance of the two second holes such that a difference in current flowing through the first pin and the third pin is reduced.

7. The printed circuit board of claim 6, wherein the electronic component is a power connector.

8. The printed circuit board of claim 6, wherein the reference layer is a power layer.

9. The printed circuit board of claim 6, wherein the diameter of the at least one first hole is about 0.35 mm and the diameter of the at least one second hole is about 0.32 mm.

10. The printed circuit board of claim 6, wherein the diameter of the at least one first hole is about 0.32 mm and the diameter of the at least one second hole is about 0.30 mm.

11. A printed circuit board configured to mount an electronic component, the printed circuit board comprising:

a reference layer; and a plurality of holes arranged in at least a first column and a second column of holes, wherein each of the plurality of holes is empty and allows no pin of the electronic component to extend therein, and wherein the at least first column of holes and the at least second column of holes are defined in the reference layer and adjacent from a respective one of a plurality of pins of the electronic component when the electronic component is mounted on the printed circuit board;

wherein diameters of the holes in the first column of holes are greater than diameters of holes in the second column of holes causing a resistance of the holes in the first column to be less than a resistance of the holes in the second column such that a difference in current flowing through a pin in the at least first column and the at least second column is reduced.

12. The printed circuit board of claim 11, wherein the electronic component is a power connector.

13. The printed circuit board of claim 12, wherein the reference layer is a power layer.

14. The printed circuit board of claim 11, wherein the diameter of the holes in the first column of holes is about 0.35 mm and the diameter of the holes in the second column of holes is about 0.32 mm.

15. The printed circuit board of claim 11, wherein the diameter of the holes in the first column of holes is about 0.32 mm and the diameter of the holes in the second column of holes is about 0.30 mm.

* * * * *